(12) United States Patent
Ryu

(10) Patent No.: US 8,085,378 B2
(45) Date of Patent: Dec. 27, 2011

(54) PRINTED CIRCUIT BOARD AND LIQUID CRYSTAL DISPLAY HAVING THE SAME

(75) Inventor: Han-jin Ryu, Seongnam (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 694 days.

(21) Appl. No.: 11/439,912

(22) Filed: May 24, 2006

(65) Prior Publication Data

US 2007/0035689 A1 Feb. 15, 2007

(30) Foreign Application Priority Data

Aug. 13, 2005 (KR) .................. 10-2005-0074581

(51) Int. Cl.
*G02F 1/1345* (2006.01)
*G02F 1/1333* (2006.01)

(52) U.S. Cl. ................. 349/149; 349/58; 349/150

(58) Field of Classification Search .......... 349/149, 349/58–60

See application file for complete search history.

(56) References Cited

U.S. PATENT DOCUMENTS

| | | | | |
|---|---|---|---|---|
| 5,204,912 A * | 4/1993 | Schimanski | | 382/147 |
| 5,768,107 A * | 6/1998 | Ouchi et al. | | 361/792 |
| 6,211,936 B1 * | 4/2001 | Nakamura | | 349/152 |
| 6,665,025 B2 * | 12/2003 | Lee | | 349/59 |
| 6,677,664 B2 * | 1/2004 | Inoue et al. | | 257/668 |
| 7,433,178 B2 * | 10/2008 | Bang et al. | | 361/679.27 |
| 2002/0100547 A1 * | 8/2002 | Takahashi et al. | | 156/289 |
| 2003/0011736 A1 * | 1/2003 | Ha et al. | | 349/149 |
| 2004/0078968 A1 * | 4/2004 | Wong | | 29/847 |
| 2005/0052512 A1 * | 3/2005 | Chen et al. | | 347/86 |
| 2005/0088093 A1 * | 4/2005 | Kim et al. | | 313/582 |

FOREIGN PATENT DOCUMENTS

| CN | 1612183 | 5/2005 |
|---|---|---|
| JP | 5-20033 | 3/1993 |
| KR | 10-2000-0020805 | 4/2000 |
| KR | 1020050065837 | 6/2005 |

\* cited by examiner

*Primary Examiner* — Mark Robinson
*Assistant Examiner* — Charles Chang
(74) *Attorney, Agent, or Firm* — F. Chau & Associates, LLC

(57) ABSTRACT

A printed circuit board (PCB) and a liquid crystal display (LCD) including the same are provided. The PCB includes a metal pattern formed on an insulating substrate, an insulating layer covering the metal pattern, and at least one insulating layer protecting pattern formed on the insulating layer. The LCD includes a liquid crystal panel, a backlight assembly providing light to the liquid crystal panel, a bottom chassis having at least one support protruding from a surface thereof and receiving the liquid crystal panel and the backlight assembly, and a printed circuit board (PCB) including a metal pattern formed on an insulating substrate, an insulating layer covering the metal pattern, and at least one insulating layer protecting pattern formed on the insulating layer, wherein the printed circuit board is connected to the surface of the bottom chassis.

23 Claims, 6 Drawing Sheets

PRINTED CIRCUIT BOARD AND LIQUID CRYSTAL DISPLAY HAVING THE SAME

CROSS-REFERENCE TO RELATED PATENT APPLICATION

This application claims priority from Korean Patent Application No. 10-2005-0074581 filed on Aug. 13, 2005, and all the benefits accruing therefrom under 35 U.S.C. §119, the contents of which in its entirety are incorporated herein by reference.

BACKGROUND OF THE INVENTION

1. Field of the Invention

The present invention relates to a printed circuit board (PCB) and a liquid crystal display (LCD) having the same, and more particularly, to a PCB connected to a surface of a bottom chassis and an LCD having the same.

2. Description of the Related Art

With development of information society, demands for various display devices have increased. Accordingly, various flat display devices such as a liquid crystal display (LCD), an electroluminescent display (ELD), a plasma display panel (PDP), and so on have been developed and widely used in a wide variety of application fields. Specifically, due to advantageous characteristics of good picture quality, thinness, lightness in weight, and low power consumption, the LCD device is widely utilized for various electronic apparatuses.

A liquid crystal display is one of flat panel display devices that have been currently used in a most extensive manner. The liquid crystal display has two substrates provided with a plurality of electrodes, and a liquid crystal layer sandwiched between the substrates. A voltage is applied to the electrodes to allow liquid crystal molecules of the liquid crystal layer to be rearranged to adjust the amount of light transmitted therethrough. Since the LCD is a non-emissive device, it cannot be used at a dark place. To overcome this drawback, an LCD employs a backlight assembly illuminating uniform light on a liquid crystal panel. The backlight assembly and the liquid crystal panel are received in a mold frame and a bottom chassis.

A PCB is disposed outside of the liquid crystal panel to generate data signals and various electric control signals for controlling an image being displayed on the liquid crystal panel. The PCB is electrically coupled to the liquid crystal panel by a tape carrier package (TCP).

To attain a compact LCD, the PCB is bent toward the backlight assembly to then be connected to the bottom chassis located therebelow. The bottom chassis has a connection hole and a support to fix and support the PCB. When the support contacts an insulating layer of the PCB, the insulating layer may be easily damaged because it is formed thinly to achieve a low-cost, lightweight, and slim PCB. That is, the insulating layer may be stripped to expose its underlying metal pattern due to external shock or vibration that may occur during transportation or handling of LCDs. This causes an electrical short between the metal pattern and the support made of the same material as the bottom chassis, e.g., metal such as aluminum (Al), thus resulting in failure or malfunction of a LCD.

BRIEF SUMMARY OF THE INVENTION

Embodiments of the present invention provide a printed circuit board designed to suppress damage to an insulating layer, and a liquid crystal display (LCD) having the PCB.

According to an embodiment of the present invention, there is provided a printed circuit board (PCB) including a metal pattern formed on an insulating substrate, an insulating layer covering the metal pattern, and at least one insulating layer protecting pattern formed on the insulating layer.

According to an embodiment of the present invention, there is provided a liquid crystal display (LCD) including a liquid crystal panel, a backlight assembly providing light to the liquid crystal panel, a bottom chassis having at least one support protruding from a surface thereof and receiving the liquid crystal panel and the backlight assembly, and a printed circuit board (PCB) including a metal pattern formed on an insulating substrate, an insulating layer covering the metal pattern, and at least one insulating layer protecting pattern formed on the insulating layer, wherein the printed circuit board is connected to the surface of the bottom chassis.

BRIEF DESCRIPTION OF THE DRAWINGS

Exemplary embodiments of the present invention can be understood in more detail from the following descriptions taken in conjunction with the attached drawings in which.

DETAILED DESCRIPTION OF EXEMPLARY EMBODIMENTS

Figure 1:
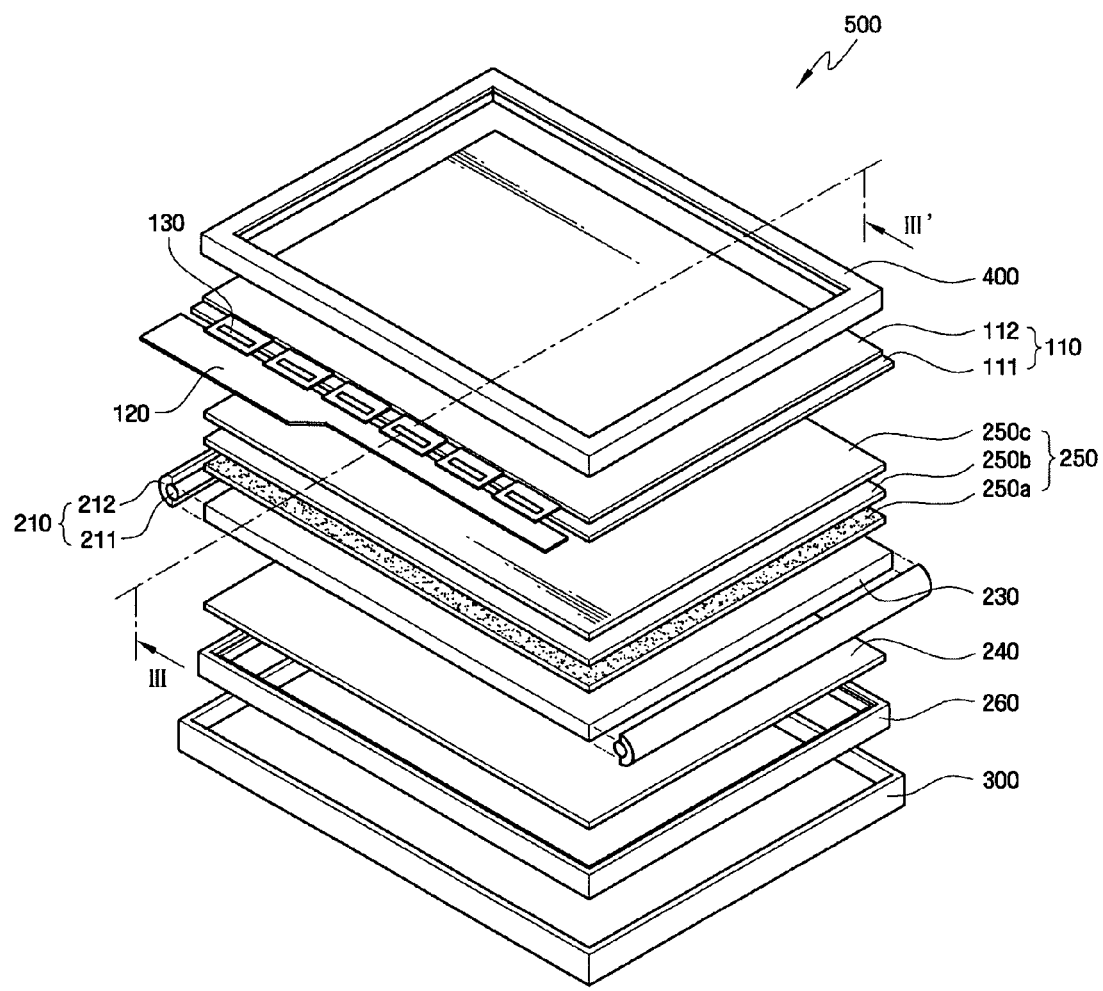
FIG. 1 shows an exploded perspective view of a liquid crystal display (LCD) according to an embodiment of the present invention.

Exemplary embodiments of the present invention and methods of accomplishing the same will now be described more fully hereinafter with reference to the accompanying drawings. The present invention may, however, be embodied in different forms and should not be construed as limited to the embodiments set forth herein. Like reference numerals refer to like elements throughout the specification.

FIG. 1 shows an exploded perspective view of a liquid crystal display (LCD) according to an embodiment of the present invention.

Referring to FIG. 1, the LCD 500 includes a liquid crystal panel 110, a backlight assembly 210, 230, 240, and 250, a mold frame 260, a bottom chassis 300 serving as a receptacle, and a top chassis 400 combined with the bottom chassis 300.

The liquid crystal panel 110 displays an image and includes first and second substrates 111 and 112 and a liquid crystal layer (not shown) sandwiched between the first and second substrates 111 and 112.

The first substrate 111 includes a plurality of gate lines arranged at regular intervals along a first direction, a plurality of data lines arranged at regular intervals along a second direction to intersect the plurality of gate lines, a plurality of pixel electrodes arranged in a matrix form within pixel areas defined by the plurality of gate lines and the plurality of data lines, and a plurality of thin film transistors switched by signals on the gate lines to transfer signals on the data lines to the pixel electrodes.

The second substrate 112 includes a black matrix pattern blocking light from outside the pixel areas, a red-green-blue (RGB) color filter pattern producing colors, and a common electrode for generating an electric field with the pixel electrode.

The first and second substrates 111 and 112 are spaced a distance apart from each other by a spacer and bonded to each other by sealant or frit glass. A liquid crystal layer having anisotropic optical properties is sandwiched between the first and second substrates 111 and 112.

A printed circuit board (PCB) 120 is electrically connected to one side of the liquid crystal panel 110 by a tape carrier package (TCP) 130. The TCP 130 has a driver integrated circuit (IC) for driving the liquid crystal panel 110 at its center. The PCB 120 and the TCP 130 apply driving signals and timing signals to the gate lines and data lines on the first substrate 111 in order to control an alignment angle and a time at which liquid crystals are aligned.

The backlight assembly 210, 230, 240, and 250 is disposed below the liquid crystal panel 110 and provides light to the liquid crystal panel 110. The backlight assembly includes a light source unit 210, a light guide plate 230, a reflective sheet 240, and an optical sheet 250.

The light source unit 210 is disposed along at least one side of the light guide plate 230 and includes a light source 211 and a light source cover 212 covering the light source 211. The light source 211 can be a linear light source, such as a cold cathode fluorescent lamp (CCFL), external electrode fluorescent lamp (EEFL), or a hot cathode fluorescent lamp (HCFL), or a point light source, such as a light emitting diode (LED). In the illustrative embodiment, a CCFL is used as the light source 211. Meanwhile, the light source unit 210 may be disposed along one long or short side or two adjacent or opposing sides of the light guide plate 230. FIG. 1 shows an example in which two light source units 210 are disposed along either of two opposing long sides of the light guide plate 230.

The light guide plate 230 has a rectangular shape and guides light emitted by the light source unit 210 upwardly toward the backlight assembly 210, 230, 240, and 250, that is, toward the liquid crystal panel 110. The light guide plate 230 is made of a highly refractive and transmissive material, for example, polymethylmethacrylate (PMMA), polycarbonate (PC) or polyethylene (PE). A light-scattering pattern is formed on a bottom surface of the light guide plate 230 to direct upward light incident from the side of the light guide plate 230. The light-scattering pattern may be formed, for example, by patterning a scattering material coated on the bottom surface of the light guide plate 230 or by forming an embossing pattern on the bottom surface thereof.

The reflective sheet 240 is disposed below the light guide plate 230 and reflects light passing downwardly through the bottom surface of the light guide plate 130, upwardly toward the light guide plate 230, thereby increasing the brightness of the backlight assembly 210, 230, 240, and 250, while allowing light to be uniformly emitted upwardly from the light guide plate 230. The reflective sheet 240 may be made of a thin, highly elastic and reflective material. For example, the reflective sheet 240 may be about 0.01 mm to about 5 mm thick polyethylene terephtalate (PET) sheet, but is not limited thereto.

The optical sheet 250 is disposed above the light guide plate 230 and uniformly irradiates light guided by the light guide plate 230 upwardly toward the backlight assembly 210, 230, 240, and 250. For example, the optical sheet 250 may be formed by selectively stacking one or more diffusion sheets 230a, prism sheets 250b and 250c, and protective sheets. Alternatively, the optical sheet 250 may be formed of only one or a plurality of the same optical sheets 250. The stacking order of the optical sheets 250 may vary within a range in which the uniformity of light can be increased. The optical sheet 250 may be formed of a transparent resin such as acrylic resin, polyurethane resin, or silicon resin.

A mold frame 260 has a receiving space to receive the backlight assembly 210, 230, 240, and 250. The mold frame 260 has the shape of a rectangular parallelepiped with an open top surface. The mold frame 260 may be made of an insulating synthetic resin.

The bottom chassis 300 is disposed below the backlight assembly 210, 230, 240, and 250 and receives and supports the liquid crystal panel 110, the backlight assembly 210, 230, 240, and 250, and the mold frame 260. The bottom chassis 300 is made of a metal such as aluminum (Al) or Al alloy.

The top chassis 400 is combined with the bottom chassis, sandwiching the liquid crystal panel 110 and the backlight assembly between them, and defines an effective display area of the liquid crystal panel 110.

Figure 2:
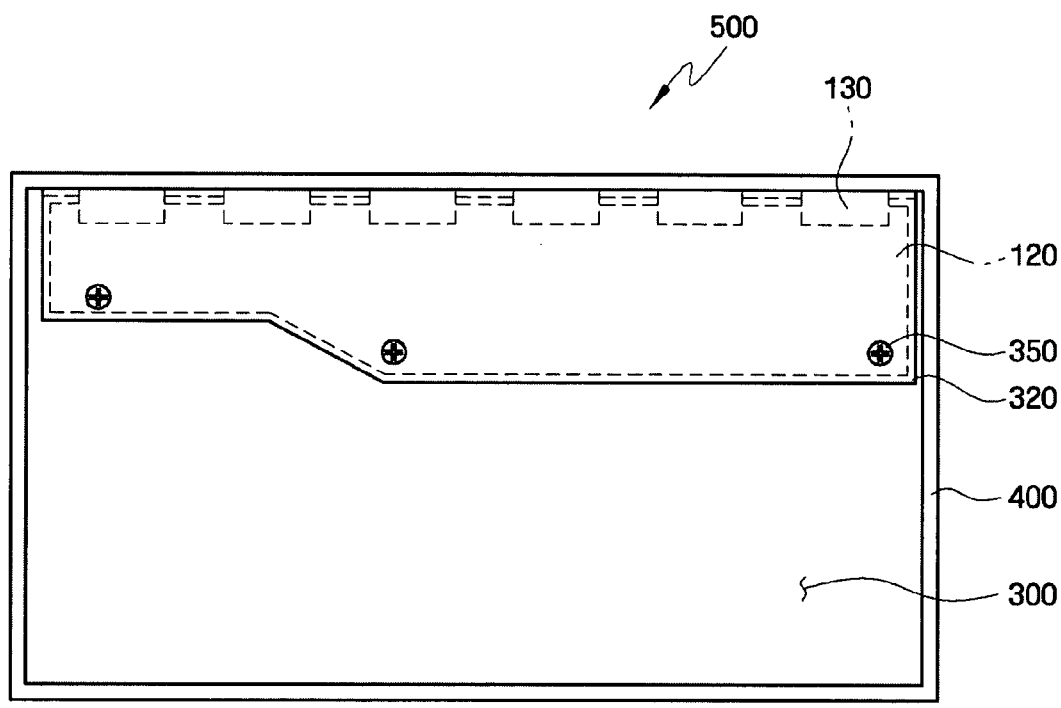
FIG. 2 shows a bottom view of the LCD shown in FIG. 1.
Figure 3:
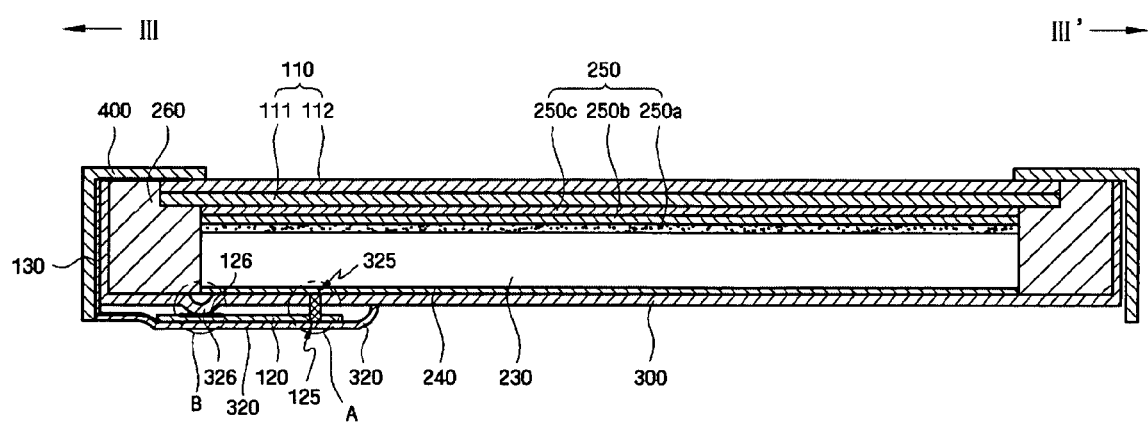
FIG. 3 shows a cross-sectional view taken along the line III-III' of FIG. 1.

FIG. 2 shows a bottom view of the LCD shown in FIG. 1, and FIG. 3 shows a cross-sectional view taken along the line III-III' of FIG. 1.

Referring to FIGS. 2 and 3, the PCB 120 is electrically connected to the liquid crystal panel 110 by the TCP 130 and connected, for example, to the rear surface of the bottom chassis 300. That is, the TCP 130 connected to the liquid crystal panel 110 passes between the bottom and top chassis 300 and 400 and is bent toward the rear surface of the bottom chassis 300. The PCB 120 is connected to the TCP 130 and connected to the rear surface of the bottom chassis 300. One surface of the PCB 120, on which a chip is mounted, faces the rear surface of the bottom chassis 300 in order to prevent damage to the chip due to an external force. A protective shield 320 is formed below the bottom chassis 300 and covers the other surface of the PCB 120.

Figure 4A:
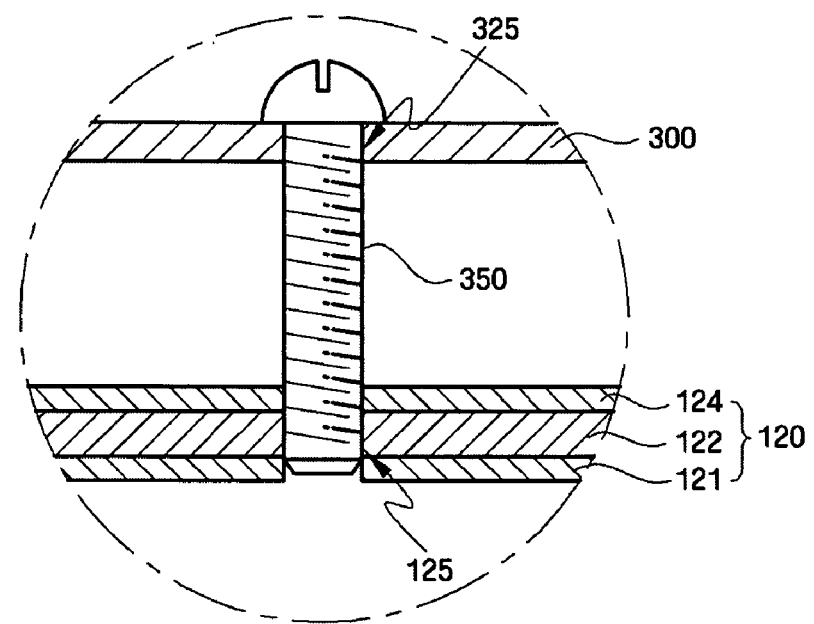
FIGS. 4A and 4B show enlarged views of a portion "A" shown in FIG. 3.
Figure 4B:
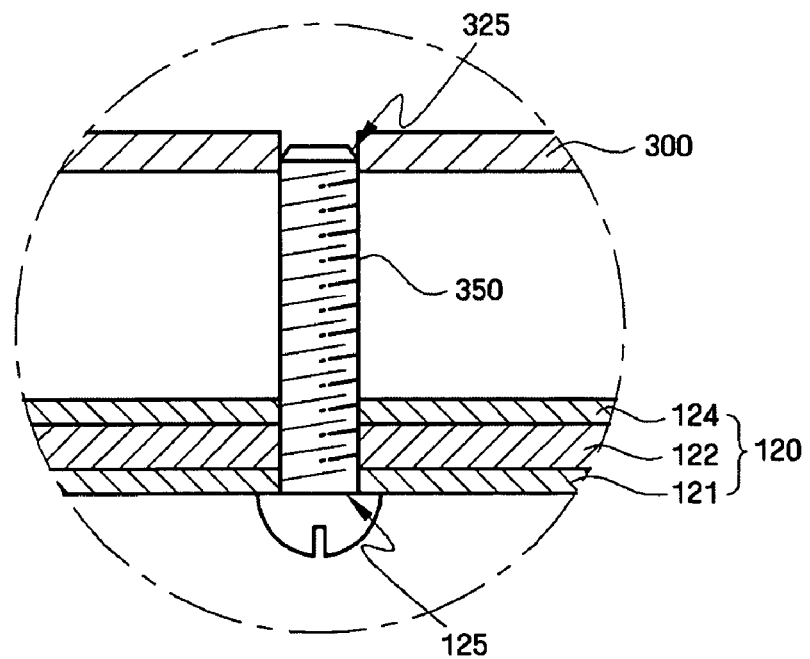

The PCB 120 and the bottom chassis 300 correspondingly have connection holes 125 and 325. The connection holes 125 and 325 may be internally threaded. FIGS. 4A and 4B show enlarged views of a portion "A" shown in FIG. 3. As shown in FIGS. 4A and 4B, the PCB 120 can be connected to the bottom chassis 300 by fitting a fastening member 350, for example, a screw, into the connection holes 125 and 325 in the PCB 120 and the bottom chassis 300. By using a screw without a head or removing a screw head after fitting the fastening member 350 into the connection holes 125 and 325, it is possible to suppress an unwanted formation of a protrusion on the inner surface of the bottom chassis 300 or the surface of the PCB 120, on which no chip is mounted.

Figure 5:
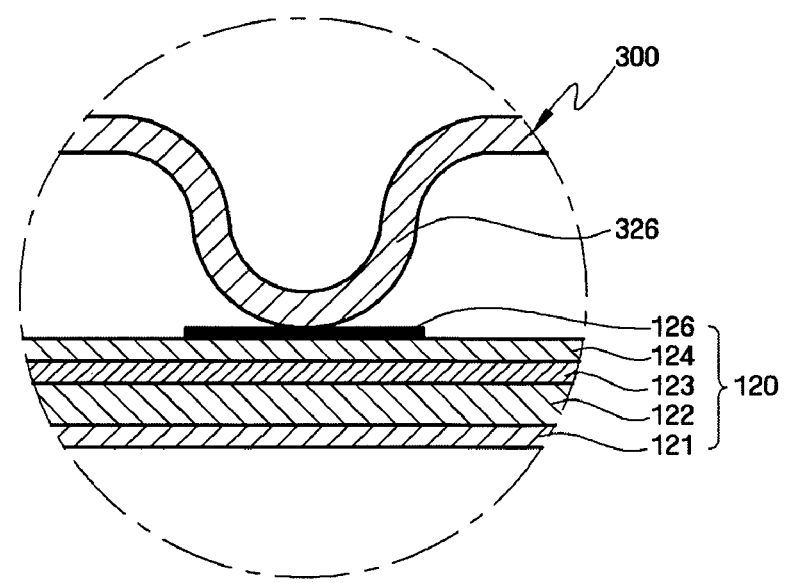
FIG. 5 shows an enlarged view of a portion "B" shown in FIG. 3.

FIG. 5 shows an enlarged view of a portion "B" shown in FIG. 3. Referring to FIGS. 3 and 5, the bottom chassis 300 further includes a support 326 supporting the PCB 120. The support 326 protrudes from a portion of the rear surface of the bottom chassis 300 and supports the PCB 120 by contacting the surface of the PCB 120.

An insulating layer protecting pattern 126 is formed on the surface of the PCB 120 contacting the support 326. The insulating layer protecting pattern 126 suppresses damage to an insulating layer 124 of the PCB 120 due to vibration or other environmental factors caused during transportation or handling.

Figure 6:
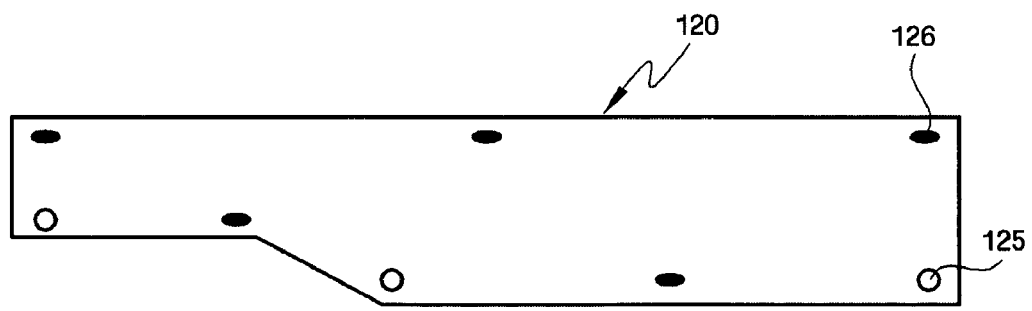
FIG. 6 shows a plan view of a printed circuit board (PCB) for an LCD according to an embodiment of the present invention.
Figure 7A:
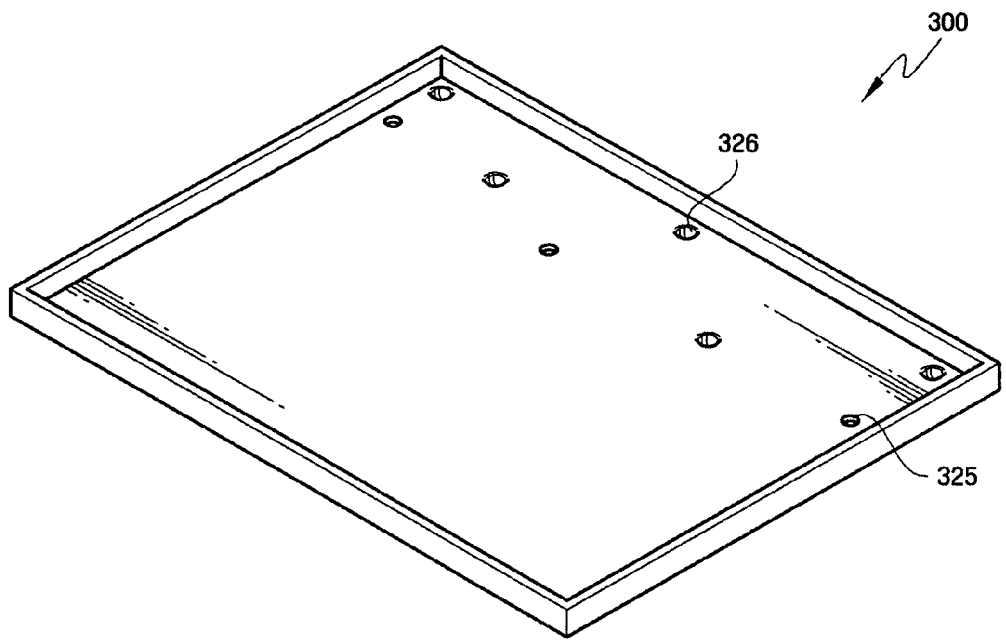
FIG. 7A shows a perspective view of a bottom chassis of the LCD according to an embodiment of the present invention.
Figure 7B:
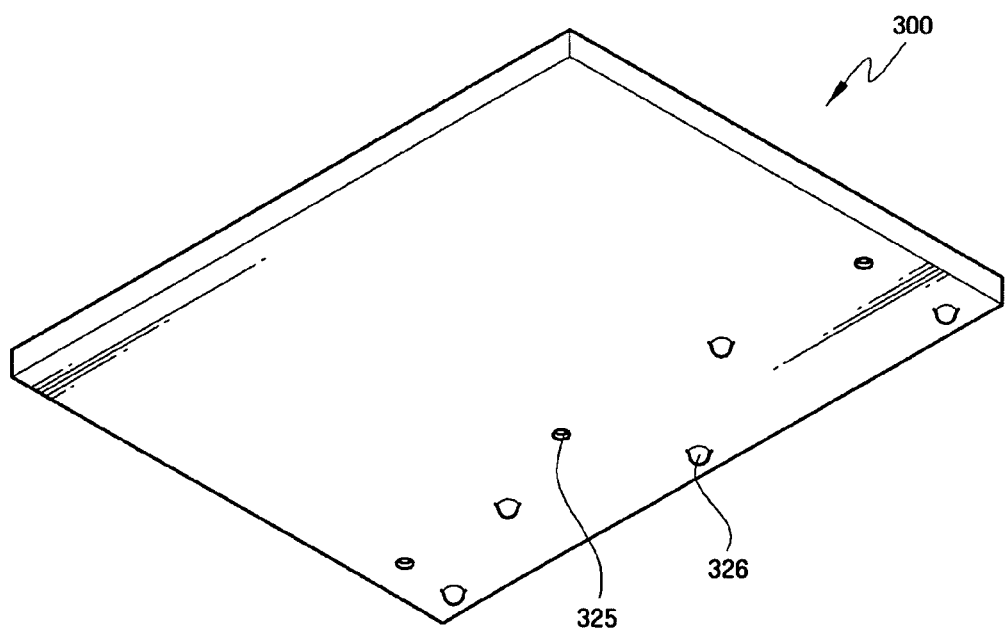
FIG. 7B shows a bottom perspective view of a bottom chassis for an LCD according to an embodiment of the present invention.

FIG. 6 shows a plan view of a printed circuit board (PCB) for an LCD according to an embodiment of the present invention, FIG. 7A shows a perspective view of a bottom chassis of the LCD according to an embodiment of the present invention, and FIG. 7B shows a bottom perspective view of a bottom chassis for an LCD according to an embodiment of the present invention.

The support and the insulating layer protecting pattern will now be described in more detail with reference to FIGS. 4A through 6.

Referring to FIGS. 4A through 6, the PCB 120 includes an insulating substrate 122 made of plastic, a metal pattern 123 formed on the insulating substrate 122 using copper or copper alloy, an upper insulating layer 124 covering the entire surface of the insulating substrate 122 having the metal pattern 123 formed thereon, and a lower insulating layer 121 formed beneath the insulating substrate 122. A plurality of connectors (not shown) are formed on the upper insulating layer 124 and electrically connected to the metal pattern 123. Various chips (not shown) are coupled to the plurality of connectors. The metal pattern 123 is formed very thinly over the insulating substrate 122.

To allow the PCB 120 to be connected to and supported by the bottom chassis 300, multiple connection holes 125 may be provided and combined with the fastening member 350 over the surface of the PCB 120. However, because the connection holes 125 penetrate the PCB 120 to provide connections as shown in FIGS. 4A and 4B, the connection holes 125 are difficult to form when the metal pattern 123 underlies the connection holes 125. Further, because the metal pattern 123 is formed with a minimum margin to achieve a low-cost PCB 120 and a lightweight LCD, it becomes more difficult to form the multiple connection holes 125. Thus, a minimum number of connection holes 125 may be formed in a portion of the PCB 120 where little or no metal pattern 123 is formed. For example, the connection holes 125 may be formed along one side of the PCB 120, opposite a side connected to the TCP 130. Although FIG. 6 shows three connection holes 125, the number of connection holes 125 may decrease to be less than or equal to three. Referring to FIGS. 7A and 7B, the same number of connection holes 325 may be formed in corresponding regions of the bottom chassis 300.

When a small number of fastening members 350 (e.g., screws) are used to connect the PCB 120 and the bottom chassis 300, the PCB 120 may not be securely supported. Consequently, the PCB 120 may make physical contact with the bottom chassis 300 causing damage to the chip mounted on the PCB 120. Additionally, the PCB 120 may make electrical contact with the bottom chassis 300, which is made of metal, causing a short circuit and resulting in failure or malfunction.

To address the potential for damage or malfunction, the bottom chassis 300 according to the present embodiment includes the support 326 as shown in FIGS. 7A and 7B. The support 326 protrudes from a portion of the rear surface of the bottom chassis 300. The support 326 may be formed by bonding a cylindrical support of a predetermined height to the rear surface of the bottom chassis 300. Preferably, the support 326 is formed from a portion of the bottom surface of the bottom chassis 300, which simplifies the manufacturing process and reduces the manufacturing cost. The support 326 has a height sufficient to prevent the PCB 120 from contacting the bottom chassis 300, determined by considering the height of the chip mounted on the PCB 120, the area of the PCB 120, and the number of supports 326. To achieve a thin LCD, it is desired that the support 326 have a minimum height considering the above conditions.

The support 326 is in contact with the upper insulating layer 124, away from the portion of the PCB 120 on which the chip is mounted. To maintain a desirable center of gravity, the support 326 is located in the region of the bottom chassis 300 away from a portion of the bottom chassis 300 connected to the corresponding portion of the PCB 120 by the fastening member 350, i.e., in the region of the bottom chassis 300 corresponding to a portion of the PCB 120 connected to the TCP 130. An appropriate number of supports 326 may be disposed along the outer perimeter of the PCB 120 to uniformly support the PCB 120. For example, as shown in FIGS. 7A and 7B, a plurality of supports 326 are disposed along one side of the bottom chassis 300 and additional supports 326 are formed along a line of the connection holes 325.

When the support 326 contacts the upper insulating layer 124 of the PCB 120 as described above, the upper insulating layer 124 may be eroded during transportation or other handling processes due to an external impact and friction resulting from vibration. In this case, since the region of the PCB 120 corresponding to the region of the bottom chassis 300 on which the supports 326 are disposed includes the metal pattern 123 formed very thinly beneath the upper insulating layer 124, unlike the region of the PCB 120 having the connection holes 125 as shown in FIGS. 4A and 4B, the underlying metal pattern 123 may be exposed when the upper insulating layer 124 is stripped off. The exposed metal pattern 123 is shorted out with the support 326 made of metal such as Al and the bottom chassis 300, thus resulting in failure and malfunction of the LCD.

To suppress damage to the upper insulating layer 124 as described above, the PCB 120 includes the insulating layer protecting pattern 126 formed on the upper insulating layer 124 of the PCB 120 and overlapping the metal pattern 123.

The insulating layer protecting pattern 126 may be formed of photo-developing ink, ultraviolet-hardening ink, thermal hardening ink, or thermal drying ink. The ink may contain epoxy resin. The ink pattern can suppress damage to the upper insulating layer 124 due to friction against the support 326. Marker ink used for the PCB 120 may be utilized as the ink to form the insulating layer protecting pattern 126 without significantly increasing the manufacturing costs. For example, S-200 containing epoxy resin available from Taiyo Co. in Japan may be used as the marker ink.

The insulating layer protecting pattern 126 may be formed by a silk screen printing technology used in printing an identification mark of a typical PCB, thus avoiding a separate process. The presence of the insulating layer protecting pattern 126 reduces failure or malfunction of the LCD, and thus the failure rate. Referring to FIGS. 5 through 7B, the same number of insulating layer protecting patterns 126 as the number of supports 326 may be formed to contact the corresponding supports 326.

Figure 8:
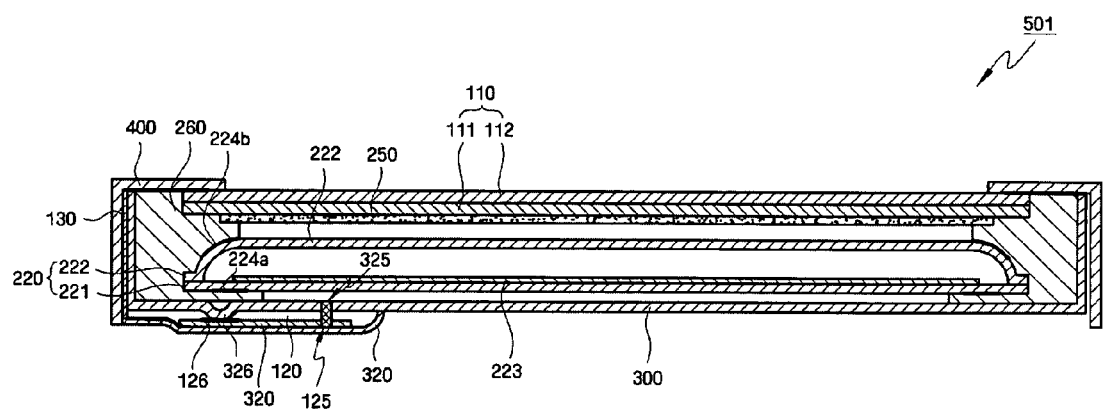
FIG. 8 shows a cross-sectional view of an LCD according to an embodiment of the present invention.

FIG. 8 shows a cross-sectional view of an LCD according to an embodiment of the present invention.

Referring to FIG. 8, a surface light source 220 is disposed below a liquid crystal panel 110 and provides light to the backlight assembly 220 and 250. The surface light source 220 includes lower and upper substrates 221 and 222. The lower substrate 221 is attached to the upper substrate 222 to create a chamber containing a discharge space. Electrodes 224a and 224b of the surface light source 220 are disposed along a side of the upper substrate 222 and extend up to a corresponding side of the lower substrate 221.

The upper substrate 222 is made of transparent insulating material such as glass and includes a planar portion and a convex portion extending in a first direction. The convex portion and the planar portion repeat alternately. The convex portion has substantially the same thickness as the planar portion. The convex portion is substantially separated from the lower substrate 221 and creates the discharge space with the lower substrate 221. A gas layer such as mercury is formed in the discharge space. FIG. 8 shows the cross-section of the convex portion of the surface light source 220.

A connecting path (not shown) may be created between discharge spaces of adjacent convex portions. As described above, the planar portion is sandwiched between the adjacent convex portions. The connecting path serves to make equal the pressure of gas between discharge spaces. Outer ends of the upper substrate 222 are planar with the same height as the planar portion to achieve bonding to the lower substrate 221. A phosphor layer (not shown) is formed on the insides of the lower and upper substrates 221 and 222 and a reflective layer 223 is formed between the phosphor layer and the lower substrate 221.

The surface light source 220 is housed within a mold frame 260 having the shape of a rectangular parallelepiped with an open top surface and a bottom chassis 300. One or more optical plates or optical sheets 250 may be disposed above the surface light source 220 to increase brightness uniformity.

The liquid crystal panel 110 is disposed above the one or more optical sheets 250. A PCB 120 connected to the liquid crystal panel 110 by a TCP 130 is connected to a rear surface of the bottom chassis 300.

The PCB 120 and the bottom chassis 300 include connection holes 125 and 325 as in FIGS. 3 and 6 described above. The PCB 120 and the bottom chassis 300 also include an insulating layer protecting pattern 126 to avoid an electrical short by protecting an insulating layer, and a support 326 fixedly supporting the PCB 120 against the bottom chassis 300. Here, the insulating layer protecting pattern 126 and the support 326 function similarly as described above.

The LCD according to an embodiment of the present invention employs a direct light type backlight assembly with the surface light source 220 disposed below the liquid crystal panel 110, thereby providing high brightness and large-area LCD. Although, a surface light source is used as a light source of a direct light type backlight assembly, a linear light source such as a CCFL may be used.

As described above, the printed circuit board (PCB) and a liquid crystal display (LCD) including the same are provided. The PCB is fixedly supported on the bottom chassis of the LCD. An insulating layer protecting pattern is used to suppress damage to an insulating layer of the PCB, thus avoiding an electrical short in the PCB as well as failure and malfunction of the LCD. Ink can be used as the insulating layer protecting pattern, thus reducing failure rate without significantly increasing manufacturing costs.

Those skilled in the art will appreciate that variations and modifications can be made to the exemplary embodiments without substantially departing from the principles of the present invention. Therefore, the disclosed exemplary embodiments of the invention, although descriptive, are not for purposes of limitation.

What is claimed is:

1. A printed circuit board (PCB) comprising:
a metal pattern formed on an insulating substrate;
an insulating layer covering the metal pattern; and
at least one insulating layer protecting pattern formed on the insulating layer, wherein the PCB is connected to a tape carrier package (TCP), all portions of the insulating layer protecting pattern are on the insulating layer, the insulating layer protecting pattern comprises an ink identification mark having resin, and the insulating layer protecting pattern contacts a support of a bottom chassis.

2. The PCB of claim 1, wherein the at least one insulating layer protecting pattern is formed of photo-developing ink, ultraviolet-hardening ink, thermal hardening ink, or thermal drying ink.

3. The PCB of claim 2, wherein the ink is marker ink used in the printed circuit board.

4. The PCB of claim 1, wherein the at least one insulating layer protecting pattern is formed using silk screen printing.

5. The PCB of claim 1, wherein the at least one insulating layer protecting pattern is disposed along the outer perimeter of the substrate.

6. The PCB of claim 1, further comprising at least one connection hole combined with a fastening member.

7. The PCB of claim 6, wherein the at least one connection hole is formed along one side of the substrate.

8. The PCB of claim 1, wherein the at least one insulating layer protecting pattern formed on the insulating layer overlaps the metal pattern.

9. The PCB of claim 1, wherein the at least one insulating layer protecting pattern protects the insulating substrate from an external impact and friction resulting from vibration.

10. The PCB of claim 1, wherein the at least one insulating layer protecting pattern is formed of a resin.

11. A liquid crystal display (LCD) comprising:
a liquid crystal panel;
a backlight assembly providing light to the liquid crystal panel;
a bottom chassis having at least one support protruding from a surface thereof and receiving the liquid crystal panel and the backlight assembly, wherein the support is formed from a portion of the bottom chassis; and
a printed circuit board (PCB) including a metal pattern formed on an insulating substrate, an insulating layer covering the metal pattern, and at least one insulating layer protecting pattern formed on the insulating layer, wherein the printed circuit board is connected to the surface of the bottom chassis and the support of the bottom chassis is in direct contact with the insulating layer protecting pattern of the printed circuit board, wherein the printed circuit board is connected to the liquid crystal panel via a tape carrier package (TCP) and all portions of the insulating layer protecting pattern are on the insulating layer, and wherein the insulating layer protecting pattern comprises an ink identification mark having resin.

12. The LCD of claim 11, wherein the at least one insulating layer protecting pattern is formed of photo-developing ink, ultraviolet-hardening ink, thermal hardening ink, or thermal drying ink.

13. The LCD of claim 12, wherein the ink is marker ink used in the printed circuit board.

14. The LCD of claim 11, wherein the at least one insulating layer protecting pattern is formed using silk screen printing.

15. The LCD of claim 11 wherein the at least one insulating layer protecting pattern is disposed along the outer perimeter of the substrate.

16. The LCD of claim 11, wherein each of the PCB and the bottom chassis further include at least one connection hole at corresponding positions, and a fastening member is fitted into the at least one corresponding connection hole in the printed circuit board and the bottom chassis.

17. The LCD of claim 16, wherein the at least one connection hole is formed in one side of the PCB and in a corresponding side of the bottom chassis.

18. The LCD of claim 11, further comprising a protective shield that is formed below the bottom chassis and covers the PCB.

19. The LCD of claim 11, wherein the at least one insulating layer protecting pattern formed on the insulating layer overlaps the metal pattern.

20. The LCD of claim 11, wherein the at least one insulating layer protecting pattern protects the insulating substrate from an external impact by a support and friction resulting from vibration.

21. The LCD of claim 11, wherein the at least one insulating layer protecting pattern is formed of a resin.

22. The LCD of claim 11, wherein the at least one support is formed on the at least one insulating layer protecting pattern and is spaced apart from where the printed circuit board is connected to the surface of the bottom chassis.

23. The LCD of claim 22, wherein the printed circuit board is connected to the surface of the bottom chassis by a fastening member.

* * * * *